(12) United States Patent
Matiash

(10) Patent No.: US 8,984,385 B1
(45) Date of Patent: *Mar. 17, 2015

(54) SYSTEMS AND METHODS FOR CYCLIC REDUNDANCY CHECK IMPLEMENTATION

(71) Applicant: Marvell Israel (M.I.S.L) Ltd., Yokneam (IL)

(72) Inventor: Ofer Matiash, Petach-Tikva (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 14/277,219

(22) Filed: May 14, 2014

Related U.S. Application Data

(63) Continuation of application No. 13/267,989, filed on Oct. 7, 2011, now Pat. No. 8,745,476.

(60) Provisional application No. 61/392,746, filed on Oct. 13, 2010.

(51) Int. Cl.
*G06F 11/10* (2006.01)
*H03M 13/00* (2006.01)

(52) U.S. Cl.
CPC ................................ *G06F 11/1004* (2013.01)
USPC ........... 714/807; 714/752; 714/758; 714/776; 714/781

(58) Field of Classification Search
USPC ........................ 714/752, 758, 776, 781, 807
See application file for complete search history.

(56) References Cited

U.S. PATENT DOCUMENTS

| | | | |
|---|---|---|---|
| 6,681,364 | B1 | 1/2004 | Calvignac et al. |
| 7,139,963 | B1 | 11/2006 | Fox |
| 7,185,266 | B2 | 2/2007 | Blightman et al. |
| 2003/0061561 | A1 | 3/2003 | Rifaat et al. |
| 2005/0086571 | A1* | 4/2005 | Farnsworth .................. 714/758 |
| 2006/0009952 | A1 | 1/2006 | Anderson et al. |
| 2006/0136801 | A1 | 6/2006 | Hickey et al. |

* cited by examiner

*Primary Examiner* — Sam Rizk

(57) ABSTRACT

In accordance with the teachings described herein, systems and methods are provided for calculating a Cyclic Redundancy Check (CRC) code for a message. A system includes a first CRC calculator and a second CRC calculator. The first CRC calculator is configured to receive a first data block of the message, and to calculate a first CRC value based at least in part on the first data block, the message including the first data block and a second data block. The second CRC calculator is configured to receive the first CRC value and the second data block of the message, and to calculate a second CRC value based on the first CRC value and the second data block, the second CRC calculator being different from the first CRC calculator.

21 Claims, 5 Drawing Sheets

SYSTEMS AND METHODS FOR CYCLIC REDUNDANCY CHECK IMPLEMENTATION

CROSS-REFERENCE TO RELATED APPLICATIONS

This is a continuation of U.S. patent application Ser. No. 13/267,989, filed on Oct. 7, 2011, which claims priority to and benefit from U.S. Provisional Patent Application No. 61/392,746, filed on Oct. 13, 2010, and entitled "Efficient Method for Pipelined CRC Implementation." The content of this provisional application is incorporated herein by reference in its entirety.

FIELD

The technology described in this patent document relates generally to generation of error codes suitable for use in computer processing systems. More particularly, systems and methods are disclosed for cyclic redundancy check implementations in data transmission systems.

BACKGROUND

Cyclic redundancy check (CRC) is a widely used technique for detecting errors in digital data, and is suitably used in data transmission, data storage and algorithms for the selection of processing cores in multi-core processor devices, for example. A CRC code typically is computed through binary polynomial division using a computational device that performs a calculation on a first part of the message and then provides the result from the initial calculation as feedback to itself for a subsequent calculation on a second part of the message.

SUMMARY

In accordance with the teachings described herein, systems and methods are provided for calculating a Cyclic Redundancy Check (CRC) code for a message in a data stream. An example system includes a first CRC calculator and a second CRC calculator. The first CRC calculator is configured to receive a first data block of the message and to calculate a first CRC value based at least in part on the first data block, the message including the first data block and a second data block. The second CRC calculator is configured to receive the first CRC value and the second data block of the message and to calculate a second CRC value based on the first CRC value and the second data block, the second CRC calculator being different from the first CRC calculator.

As further examples, the system includes one or more additional CRC calculators, where the first CRC calculator, the second CRC calculator, and the one or more CRC calculators are cascaded in series. Each of the one or more additional CRC calculators is configured to receive an intermediate CRC value from a previous CRC calculator in the cascaded series and a data block of the message, and to calculate a new CRC value based on the received intermediate CRC value and the received data block, the previous CRC calculator being different from any other CRC calculators in the cascaded series. The intermediate CRC value received from the previous CRC calculator is determined based in part on CRC values calculated at all previous CRC calculators in the cascaded series. A last CRC calculator in the cascaded series is configured to output the CRC code of the message. Each of the cascaded CRC calculators is configured to receive a data block of the message based on a location of the data block in the message.

As additional examples, each of the cascaded CRC calculators includes one or more polynomial calculators and a register. The one or more polynomial calculators are configured to receive a data block of the message, and to calculate a CRC value based at least in part on the received data block. The register is configured to store the calculated CRC value, and to output the calculated CRC value to a next CRC calculator after a predetermined period of time, the next CRC calculator being different from any other CRC calculators in the cascaded series. The second CRC calculator is configured to output the second CRC value as the CRC code for the message when the second data block is the last data block of the message.

As further examples, the system includes a third CRC calculator and a fourth CRC calculator. The third CRC calculator is configured to receive the second CRC value and a third data block of the message, and to calculate a third CRC value based on the second CRC value and the third data block. The fourth CRC calculator is configured to receive the third CRC value and a fourth data block of the message, and to output the CRC code of the message based on the third CRC value and the fourth data block. The first CRC calculator is configured to receive an additional input, and to calculate the first CRC value based on the first data block and the additional input, the additional input having a predetermined value. The first CRC calculator is configured to receive a zero as the additional input for calculating the first CRC value. The first CRC calculator is further configured to receive a third data block of a second message, and to calculate a third CRC value based at least in part on the third data block, the second message including the third data block and a fourth data block. The second CRC calculator is further configured to receive the third CRC value and the fourth data block of the second message, and to calculate a fourth CRC value based on the third CRC value and the fourth data block.

As another example, a method is provided for calculating a Cyclic Redundancy Check (CRC) code for a message in a data stream. A message including a first data block and a second data block is received. The first data block of the message is received at a first CRC calculator. A first CRC value is calculated based at least in part on the first data block, and provided to a second CRC calculator for calculating a second CRC value based on the second data block of the message and the first CRC value, the second CRC calculator being different from the first CRC calculator.

As further examples, the second data block of the message is received at the second CRC calculator. The second CRC value is calculated based on the first CRC value and the second data block of the message, and output as the CRC code of the message. For each of the remaining data blocks of the message other than the first data block, the data block is received at a CRC calculator associated with the data block. A CRC value is calculated for the data block based on the data block and a previous CRC value for a previous data block of the message. When the data block is not the last data block of the message, the CRC value is provided to a next CRC calculator for calculating a next CRC value based on the CRC value and a next data block of the message, the CRC calculator being different from all previous CRC calculators. A final CRC value calculated for the last data block of the message is output as the CRC code of the message.

As additional examples, an additional input is received at the first CRC calculator. The first CRC value is calculated based on the first data block and the additional input, the additional input having a predetermined value. The first CRC value is calculated based on the first data block and the additional input having a value of zero. A second message including a third data block and a fourth data block is received. The third data block of the second message is received at the first CRC calculator. A third CRC value is calculated based at least in part on the third data block, and provided to the second CRC calculator for calculating a fourth CRC value based on the fourth data block of the message and the third CRC value. One of a plurality of data processors is selected to process the message based on the CRC code of the message.

DETAILED DESCRIPTION

To calculate a CRC code of a message, the message is divided into multiple blocks of equal size, in an embodiment, and these blocks of the message are then processed, one by one, by a single CRC calculator. Specifically, the CRC calculator generates an intermediate CRC value for a particular block of the message (except the last block of the message), and then provides the intermediate CRC value as a feedback to be used for calculating another CRC value for the next block of the message. When the CRC calculator finishes processing the last block of the message, the calculated CRC value of the last block of the message is output as the CRC code for the message. This single-CRC-calculator approach usually requires a plurality of multiplexers in front of the CRC calculator, or a single multiplexer selecting from among many inputs, and thus requires a lot of real estate and routing resources. Instead, in accordance with an embodiment, multiple CRC calculators are used to calculate a CRC code of a message.

Figure 1:
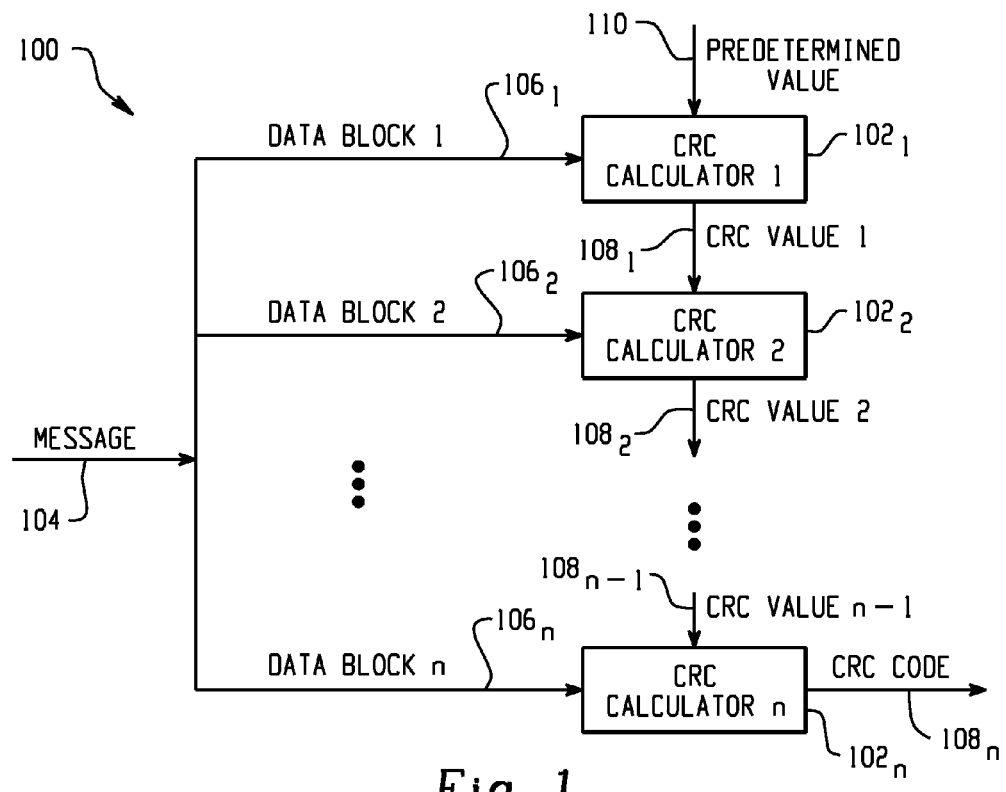
FIG. 1 shows a diagram of an example system for calculating a CRC code for a message using multiple CRC calculators.

FIG. 1 shows a diagram of an example system 100 for calculating a CRC code for a message 104 using multiple CRC calculators. The example system 100 includes a plurality of CRC calculators $102_1, 102_2, \ldots, 102_n$. Each of the CRC calculators $102_1, 102_2, \ldots, 102_n$ receives a data block which is a portion of the message 104, and provides a calculated CRC value to a next CRC calculator. The next CRC calculator is configured to calculate a new CRC value based on the CRC value calculated in a previous CRC calculator and a next data block of the message 104 until the last CRC calculator $102_n$ outputs the CRC code of the complete message 104.

Specifically, in an embodiment, the message 104 is transmitted in a data stream that is received at the system 100. In an example, the data stream is received from a network. Message 104 includes a plurality of data blocks $106_1, 106_2, \ldots, 106_n$. The CRC calculators $102_1, 102_2, \ldots, 102_n$ each receive one of the data blocks and an additional input, and calculate a CRC value based on the received data block and the additional input. The additional input for the first CRC calculator $102_1$ has a predetermined value 110 (e.g., 0), while the additional input for each of the CRC calculators $102_2, \ldots, 102_n$ is a CRC value (e.g., $108_1, \ldots, 108_{n-1}$) calculated by a previous CRC calculator. The CRC value $108_n$ calculated by the final CRC calculator $102_n$ is output as the CRC code of the message 104.

The CRC calculators $102_1, 102_2, \ldots, 102_n$ in the embodiment of FIG. 1 are cascaded in series, and each of the CRC calculators receives a data block (e.g., $106_1, 106_2, \ldots, 106_n$) of the message 104 based on a location of the data block in the message 104. Further, in an embodiment, the CRC code of the message 104 is suitably used in an algorithm for selecting, e.g. randomly or pseudo-randomly selecting, a processing core in a multi-processor system to process the message.

Figure 2:
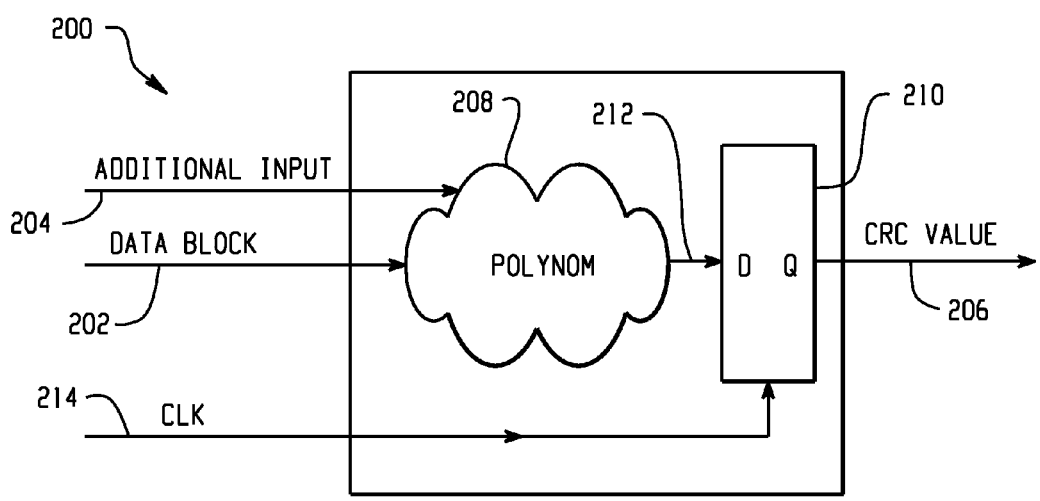
FIG. 2 shows a diagram of an example CRC calculator.

FIG. 2 shows a diagram of an example CRC calculator 200. The CRC calculator 200 receives a data block 202 and an additional input 204, and generates a CRC value 206 as an output. In particular, the CRC calculator 200 includes two or more polynomial calculators 208 and a register 210. For example, the polynomial calculators 208 are arranged in cascade. The polynomial calculators 208 receive the data block 202, and the additional input 204 which has a predetermined value (e.g., 0) or another CRC value generated by a previous CRC calculator. Then, the polynomial calculators 208 generate an intermediate output 212 (e.g., the CRC value 206) based on the data block 202 and the additional input 204. The register 210 stores the intermediate output 212, and outputs the CRC value 206 at a particular time determined by a clock signal 214.

Figure 3:
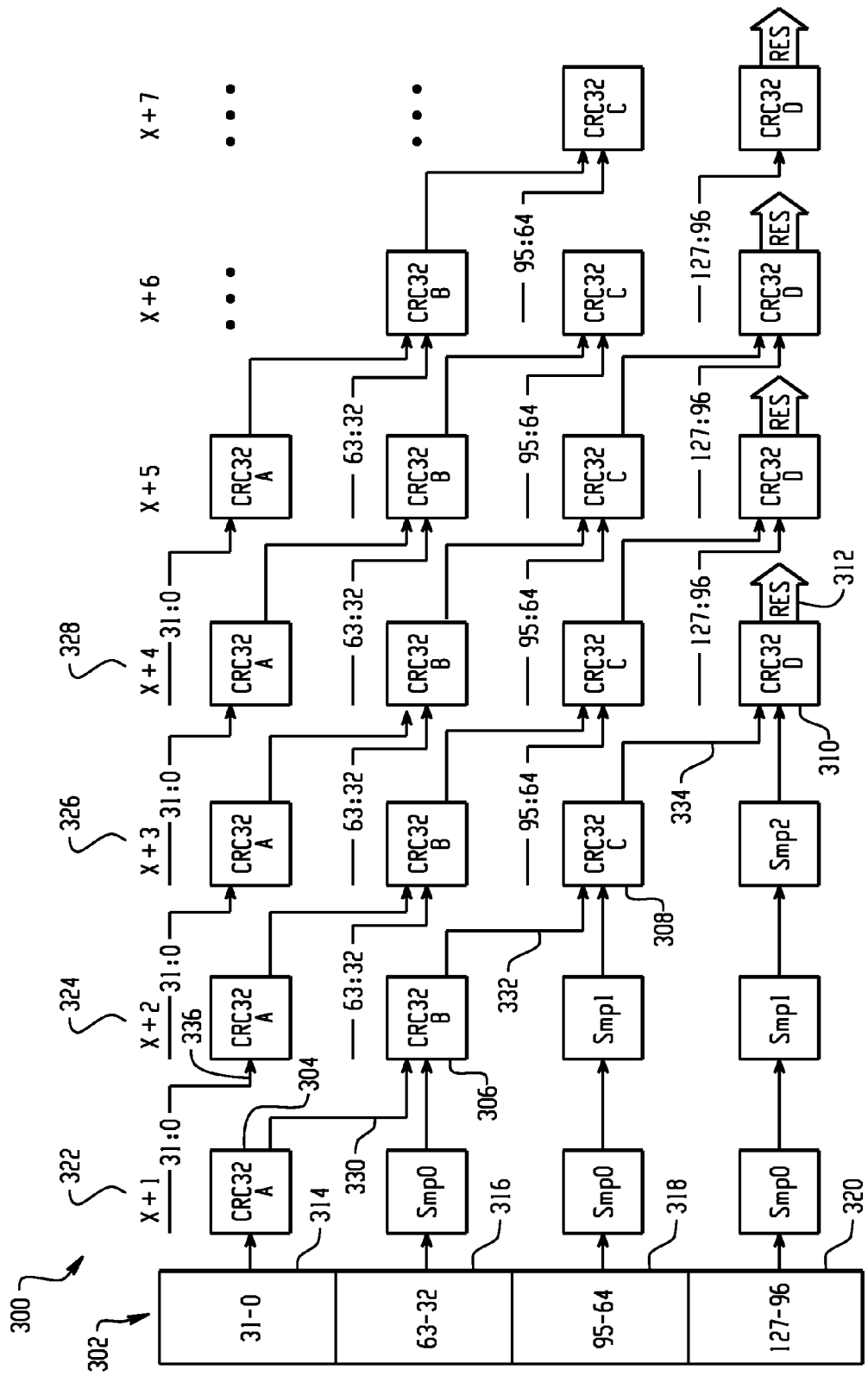
FIG. 3 shows a timing diagram of an example for calculating a CRC code for an 128-bit message using four CRC calculators.

FIG. 3 shows at 300 a timing diagram of an example embodiment for calculating a CRC code for a 128-bit message 302 using four CRC calculators 304, 306, 308, and 310 arranged in cascade. During different time periods, the CRC calculators each receive a data block of the message 302, and provide a previously calculated CRC value to a next CRC calculator for calculating a new CRC value, until the final CRC calculator 310 outputs the CRC code 312 for the message 302.

Specifically, in the example seen, the 128-bit message 302 is divided into four data blocks, 314, 316, 318, and 320, each having 32 bits of data. Each of the CRC calculators 304, 306, 308, and 310 receives a data block based on the location of the data block in the message 302. During a first time period 322, the CRC calculator 304 receives the data block 314 and a predetermined additional input (not shown), and generates a CRC value 330 which is provided to the CRC calculator 306. Then, in a time period 324, the CRC calculator 306 receives the data block 316 and the CRC value 330, and generates another CRC value 332 which is provided to the CRC calculator 308. Further, the CRC calculator 308 receives the data block 318 and the CRC value 332 in a time period 326, and outputs a CRC value 334 to the CRC calculator 310. Lastly, during a time period 328, the CRC calculator 310 outputs the CRC code result 312 for the message 302 based on the received data block 320 and the CRC value 334.

Similarly, the four CRC calculators 304, 306, 308, and 310 are used to process subsequent messages. For example, when another data block 336 of a new message arrives at the CRC calculator 304 during the time period 324, the CRC calculator 304 has already processed the data block 314, and thus is free to begin processing the data block 336 to initiate a new cycle for the new message.

A CRC-32 polynomial is used for calculating the CRC code of the message in this example. Other CRC polynomials, such as CRC-8, CRC-16, and CRC-64, can be implemented to similarly carry out the CRC code calculation.

Figure 4:
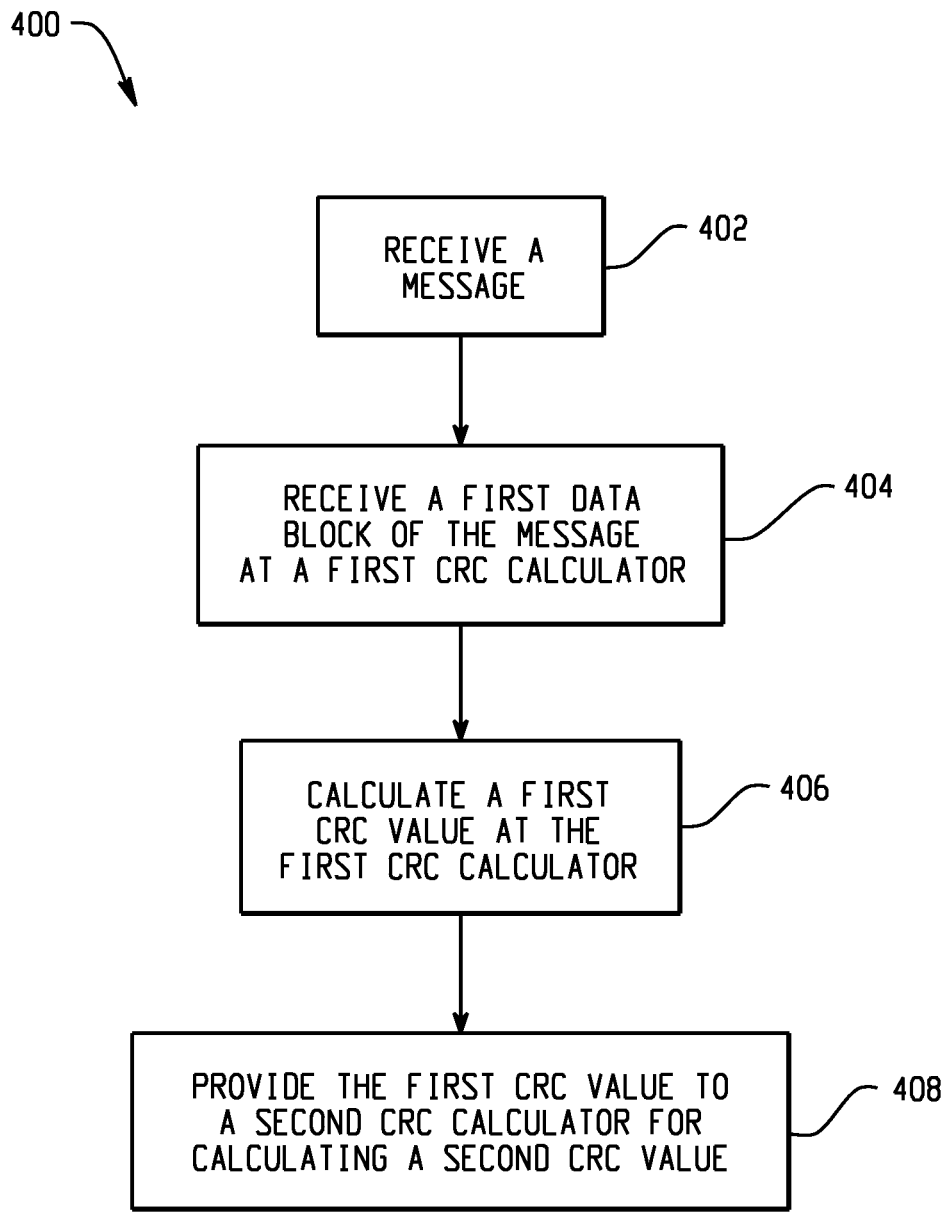
FIG. 4 shows an example flow diagram for calculating a CRC code for a message using two CRC calculators.

FIG. 4 shows at 400 an example flow diagram for calculating a CRC code for a message using two CRC calculators. The message, including at least a first data block and a second data block, is received at 402. The first data block is received at a first CRC calculator at 404. The first CRC value is calculated based at least in part on the first data block at 406. In an embodiment, at 406 the first CRC value is calculated based on the first data block and an additional input. Then the first CRC value is provided to a second CRC calculator for calculating a second CRC value based on the second data block of the message and the first CRC value at 408. The second CRC value is output as the CRC code for the entire message.

Figure 5:
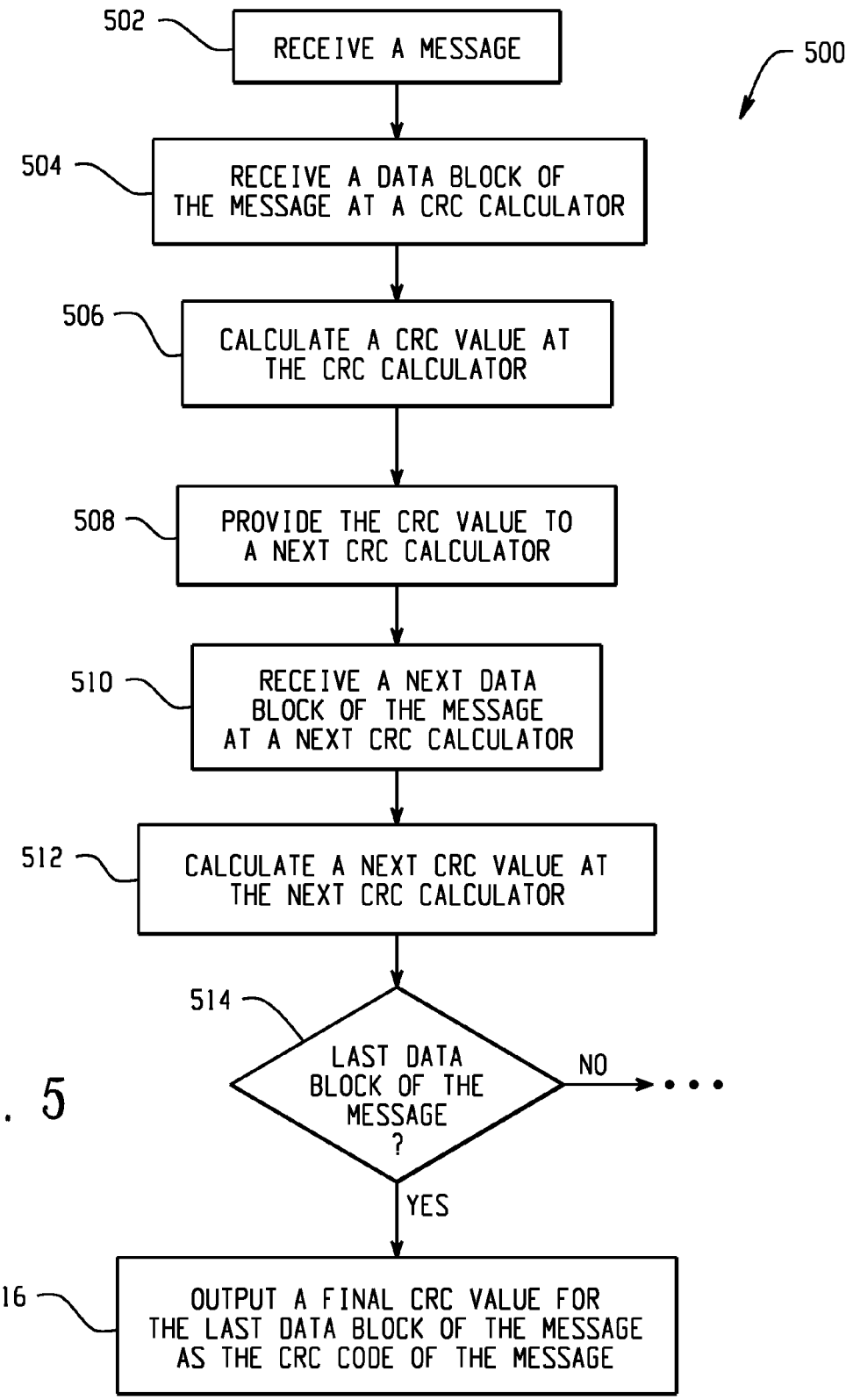
FIG. 5 shows an example flow diagram for calculating a CRC code for a message using multiple CRC calculators.

FIG. 5 shows at 500 an example flow diagram for calculating a CRC code for a message using multiple CRC calculators. The message, including multiple data blocks, is received at 502. At 504, a data block of the message is received at a CRC calculator. A CRC value is calculated at the CRC calculator at 506. In an embodiment, at 506 the CRC value is calculated based on the data block and an additional input. It is noted that the additional value is zero or some other suitable value. Then, at 508, the calculated CRC value is provided to a next CRC calculator. A new data block of the message is also received at the next CRC calculator at 510. A next CRC value is calculated at the next CRC calculator at 512.

A determination of whether a last data block of the message is being processed is performed at 514. If the new data block processed at the next CRC calculator is the last data block of the message, then the next CRC value is output as the CRC code of the message at 516. If the last data block of the message has not been processed yet, then the process continues in cascade to a following CRC calculator until the last data block of the message has been processed.

Figure 6:
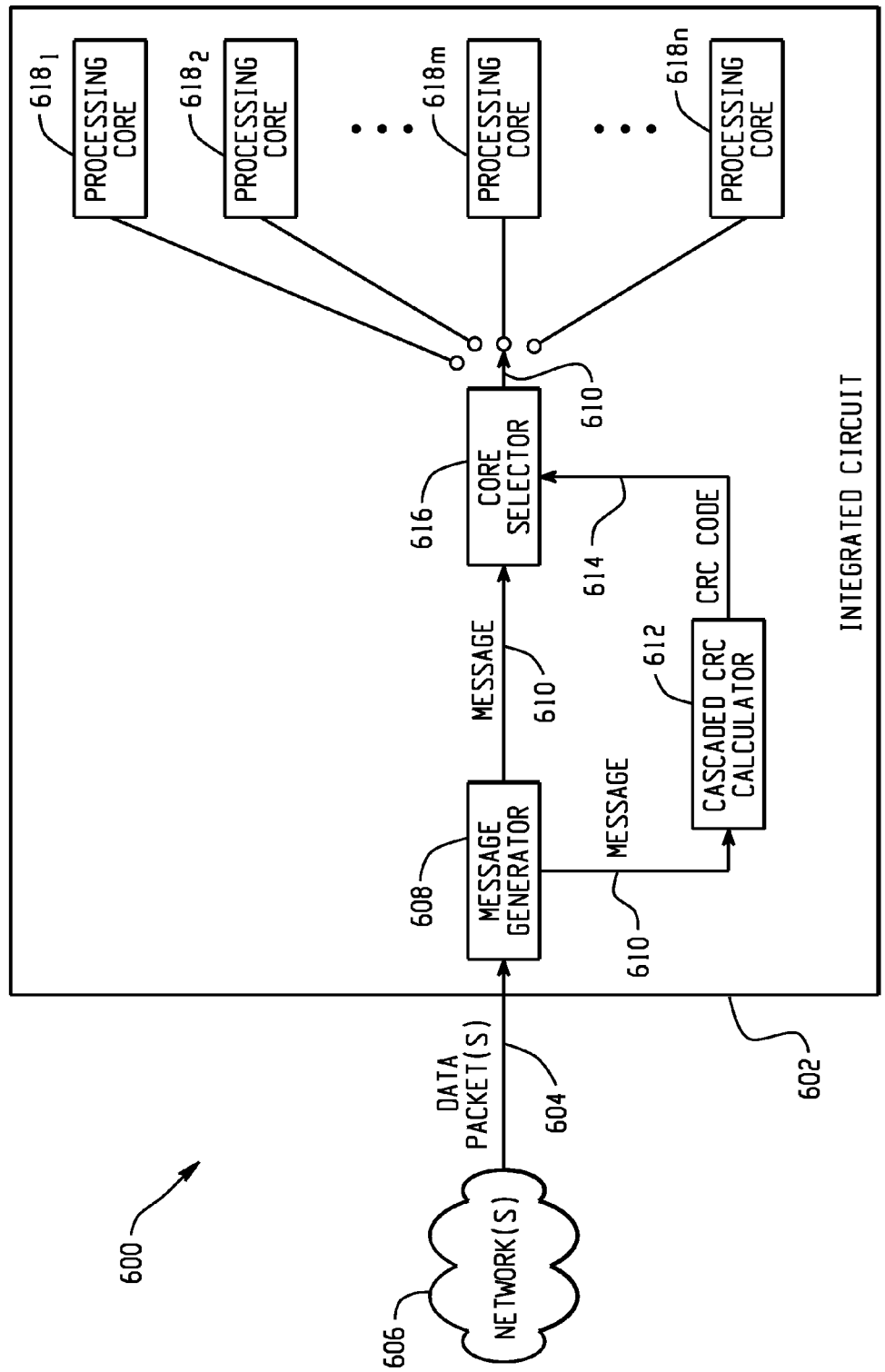
FIG. 6 shows a diagram of an example system for selecting a processing core to process a message based on a CRC code calculated for the message.

FIG. 6 shows a diagram of an example system 600 for selecting a processing core to process a message based on a CRC code calculated for the message. The example system 600 includes an integrated circuit 602 which receives an incoming data packet 604 from a network 606. A message generator 608 in the integrated circuit 602 generates one or more messages 610 from the data packet 604, and a cascaded CRC calculator 612 calculates a CRC code 614 for the message 610. A core selector 616 routes the message 610, based on the calculated CRC code 614, to one of multiple processing cores $618_1, 618_2, \ldots, 618_m, \ldots, 618_n$ that are contained in the integrated circuit 602 for processing. For instance, in the illustrated example, the core selector 616 routes the message 610 to the processing core $618_m$ for processing, as shown in FIG. 6.

This written description uses examples to disclose the invention, include the best mode, and also to enable a person skilled in the art to make and use the invention. The patentable scope of the invention includes other examples that occur to those skilled in the art.

The invention claimed is:

1. A system for calculating a Cyclic Redundancy Check (CRC) code for a first message that includes a plurality of data blocks, the system comprising:
a first CRC calculator configured to receive a first data block of the first message, and to calculate a first CRC value utilizing a first hardware element based at least in part on the first data block, the first CRC calculator being configured to receive the first data block of received messages, the first message including the first data block and a second data block; and
a second CRC calculator configured to receive the first CRC value and the second data block of the first message, and to calculate a second CRC value based on the first CRC value and the second data block, the second CRC calculator being configured to calculate the second CRC value utilizing a second hardware element that is different from the first hardware element utilized by the first CRC calculator,
wherein the first CRC calculator is further configured to receive a data block of a second message at substantially the same time that the second CRC calculator receives the second data block of the first message.

2. The system of claim 1, further comprising:
one or more additional CRC calculators, wherein the first CRC calculator, the second CRC calculator, and the one or more CRC calculators are cascaded in series.

3. The system of claim 2, wherein each of the one or more additional CRC calculators is configured to receive an intermediate CRC value from a previous CRC calculator in the cascaded series and a data block of the first message, and to calculate a new CRC value based on the received intermediate CRC value and the received data block, the previous CRC calculator being different from any other CRC calculators in the cascaded series.

4. The system of claim 3, wherein the previous CRC calculator is configured to determine the intermediate CRC value based in part on CRC values calculated at all previous CRC calculators in the cascaded series, and a last CRC calculator in the cascaded series is configured to output the CRC code of the first message.

5. The system of claim 2, wherein each of the cascaded CRC calculators is configured to receive a data block of the first message based on a location of the data block in the first message.

6. The system of claim 2, wherein each of the cascaded CRC calculators includes one or more polynomial calculators and a register; and
wherein the one or more polynomial calculators are configured to receive a data block of the first message, and to calculate a CRC value based at least in part on the received data block, and the register is configured to store the calculated CRC value, and to output the calculated CRC value to a next CRC calculator after a predetermined period of time, the next CRC calculator being different from any other CRC calculators in the cascaded series.

7. The system of claim 1, wherein the second CRC calculator is configured to output the second CRC value as the CRC code for the first message when the second data block is the last data block of the first message.

8. The system of claim 1, further comprising:
a third CRC calculator configured to receive the second CRC value and a third data block of the first message, and to calculate a third CRC value based on the second CRC value and the third data block; and
a fourth CRC calculator configured to receive the third CRC value and a fourth data block of the first message, and to output the CRC code of the first message based on the third CRC value and the fourth data block.

9. The system of claim 1, wherein the first CRC calculator is configured to receive an additional input, and to calculate the first CRC value based on the first data block and the additional input, the additional input having a predetermined value.

10. The system of claim 9, wherein the first CRC calculator is configured to receive a zero as the additional input for calculating the first CRC value.

11. The system of claim 1, wherein the first CRC calculator is further configured to calculate a third CRC value based at least in part on the data block of the second message; and wherein the second CRC calculator is further configured to receive the third CRC value and a second data block of the second message, and to calculate a fourth CRC value based on the third CRC value and the second data block of the second message.

12. The system of claim 1, wherein the first CRC calculator is configured to always receive the first data block of received messages, and wherein the second CRC calculator is configured to always receive the second data block of received messages.

13. An integrated circuit, comprising:
a plurality of processing cores for performing a computer processor function;
a message generator configured to generate messages, the messages each including a plurality of data blocks;
a system for calculating a Cyclic Redundancy Check (CRC) code for a message according to claim 1, the system being configured to receive generated messages and to compute a CRC code for a selected message; and
a processing core selector configured to select one of the processing cores to perform the computer processor function based on the CRC code computed by the system.

14. A method for calculating a Cyclic Redundancy Check (CRC) code for a first message that includes a plurality of data blocks, the method comprising:
receiving a first message including a first data block and a second data block;
receiving the first data block of the first message at a first CRC calculator that is configured to receive the first data block of received messages;
calculating at the first CRC calculator a first CRC value based at least in part on the first data block utilizing a first hardware element;
receiving the second data block of the first message at the second CRC calculator at substantially the same time as the first CRC calculator receiving a data block of a second message; and
providing the first CRC value to a second CRC calculator for calculating a second CRC value based on the second data block of the first message and the first CRC value, the second CRC calculator calculating the second CRC value utilizing a second hardware element that is different from the first hardware element utilized by the first CRC calculator.

15. The method of claim 14, further comprising:
receiving the second data block of the first message at the second CRC calculator;
calculating at the second CRC calculator the second CRC value based on the first CRC value and the second data block of the first message; and
outputting the second CRC value as the CRC code of the first message.

16. The method of claim 14, further comprising:
for each of the remaining data blocks of the first message other than the first data block;
receiving the data block at a CRC calculator associated with the data block;
calculating at the CRC calculator associated with the data block a CRC value for the data block based on the data block and a previous CRC value for a previous data block of the first message;
when the data block is not the last data block of the first message, providing the CRC value to a next CRC calculator for calculating a next CRC value based on the CRC value and a next data block of the first message, the next CRC calculator being different from all previous CRC calculators; and
outputting a final CRC value calculated for the last data block of the first message as the CRC code of the first message.

17. The method of claim 14, further comprising:
receiving an additional input at the first CRC calculator; and
calculating the first CRC value based on the first data block and the additional input, the additional input having a predetermined value.

18. The method of claim 17, wherein calculating the first CRC value based on the first data block and the additional input includes calculating the first CRC value based on the first data block and zero.

19. The method of claim 14, further comprising:
receiving the second message;
calculating at the first CRC calculator a third CRC value based at least in part on the data block of the second message; and
providing the third CRC value to the second CRC calculator for calculating a fourth CRC value based on a second data block of the second message and the third CRC value.

20. The method of claim 19, further comprising:
receiving the second data block of the second message at the second CRC calculator;
calculating at the second CRC calculator the fourth CRC value based on the third CRC value and the second data block of the second message; and
outputting the fourth CRC value as the CRC code of the second message.

21. The method of claim 14, further comprising:
selecting one of a plurality of data processors to process the first message based on the CRC code of the first message.

* * * * *